US012573579B2

(12) United States Patent
Likhanskii et al.

(10) Patent No.: US 12,573,579 B2
(45) Date of Patent: Mar. 10, 2026

(54) HYBRID APPARATUS, SYSTEM AND TECHNIQUES FOR MASS ANALYZED ION BEAM

(71) Applicant: Applied Materials, Inc., Santa Clara, CA (US)

(72) Inventors: Alexandre Likhanskii, Malden, MA (US); Peter F. Kurunczi, Cambridge, MA (US); Nirbhav Singh Chopra, Princeton, NJ (US); Anthony Renau, West Newbury, MA (US); Joseph C. Olson, Beverly, MA (US); Frank Sinclair, Hartland, ME (US)

(73) Assignee: Applied Materials, Inc., Santa Clara, CA (US)

( * ) Notice: Subject to any disclaimer, the term of this patent is extended or adjusted under 35 U.S.C. 154(b) by 405 days.

(21) Appl. No.: 18/131,287

(22) Filed: Apr. 5, 2023

(65) Prior Publication Data

US 2024/0339288 A1     Oct. 10, 2024

(51) Int. Cl.
H01J 37/05        (2006.01)
H01J 37/09        (2006.01)
(Continued)

(52) U.S. Cl.
CPC .......... H01J 37/05 (2013.01); H01J 37/1472 (2013.01); H01J 37/3171 (2013.01); H01J 37/09 (2013.01);
(Continued)

(58) Field of Classification Search
None
See application file for complete search history.

(56) References Cited

U.S. PATENT DOCUMENTS 5,317,161 A  *   5/1994  Chalupka ................ H01J 27/10
                                            315/111.81
10,192,727 B2    1/2019  Sinclair et al.
                   (Continued)

FOREIGN PATENT DOCUMENTS

TW        201828326 A    8/2018
TW        202036634 A    10/2020
WO        2015035872 A    3/2015

OTHER PUBLICATIONS

International Search Report and Written Opinion for International Application No. PCT/US2024/022228, mailed on Aug. 6, 2024, 6 pages.

*Primary Examiner* — Robert H Kim
*Assistant Examiner* — Alina Kaliszewski
(74) *Attorney, Agent, or Firm* — KDW Firm, PLLC

(57)        ABSTRACT

An apparatus, including an electrodynamic mass analysis (EDMA) assembly. The EDMA assembly may include a first upper electrode, disposed above a beam axis; and a first lower electrode, disposed below the beam axis, opposite the first upper electrode, the EDMA assembly arranged to receive a first RF voltage signal at a first frequency. The apparatus may include a deflection assembly, disposed downstream to the EDMA assembly, the deflection assembly comprising a blocker, disposed along the beam axis. The apparatus may include an energy spread reducer (ESR), disposed downstream to the deflection assembly, the energy spread reducer arranged to receive a second RF voltage signal at a second frequency, twice the first frequency. The ESR may include an upper ESR electrode, disposed above the beam axis; and a lower ESR electrode, disposed below the beam axis.

20 Claims, 15 Drawing Sheets

(51) Int. Cl.

| | |
|---|---|
| *H01J 37/12* | (2006.01) |
| *H01J 37/147* | (2006.01) |
| *H01J 37/317* | (2006.01) |

(52) U.S. Cl.

CPC ......... *H01J 37/12* (2013.01); *H01J 2237/053* (2013.01); *H01J 2237/057* (2013.01); *H01J 2237/1207* (2013.01); *H01J 2237/2505* (2013.01)

(56) References Cited

U.S. PATENT DOCUMENTS

| | | | | |
|---|---|---|---|---|
| 10,763,072 | B1 | 9/2020 | Sinclair et al. | |
| 2008/0116391 | A1* | 5/2008 | Ito | H01J 37/28 |
| | | | | 250/396 ML |
| 2008/0251734 | A1* | 10/2008 | Tsukihara | H01J 37/304 |
| | | | | 250/396 ML |
| 2009/0206248 | A1* | 8/2009 | Makarov | H01J 49/06 |
| | | | | 250/424 |
| 2014/0374617 | A1* | 12/2014 | Kabasawa | H01J 37/05 |
| | | | | 250/396 R |
| 2016/0020063 | A1* | 1/2016 | Yamada | H01J 37/141 |
| | | | | 250/398 |
| 2016/0203964 | A1 | 7/2016 | Damoc | |
| 2018/0151329 | A1* | 5/2018 | Luiten | H01J 37/05 |
| 2018/0218894 | A1 | 8/2018 | Likhanskii | |
| 2018/0286653 | A1* | 10/2018 | Sinclair | H01J 49/22 |
| 2020/0294755 | A1* | 9/2020 | Sinclair | H01J 37/1472 |
| 2021/0066022 | A1* | 3/2021 | Meng | H01J 37/1477 |
| 2022/0139691 | A1 | 5/2022 | Likhanskii et al. | |
| 2023/0154722 | A1* | 5/2023 | Bleeker | H01J 37/244 |
| | | | | 250/310 |

* cited by examiner

800 ⟍

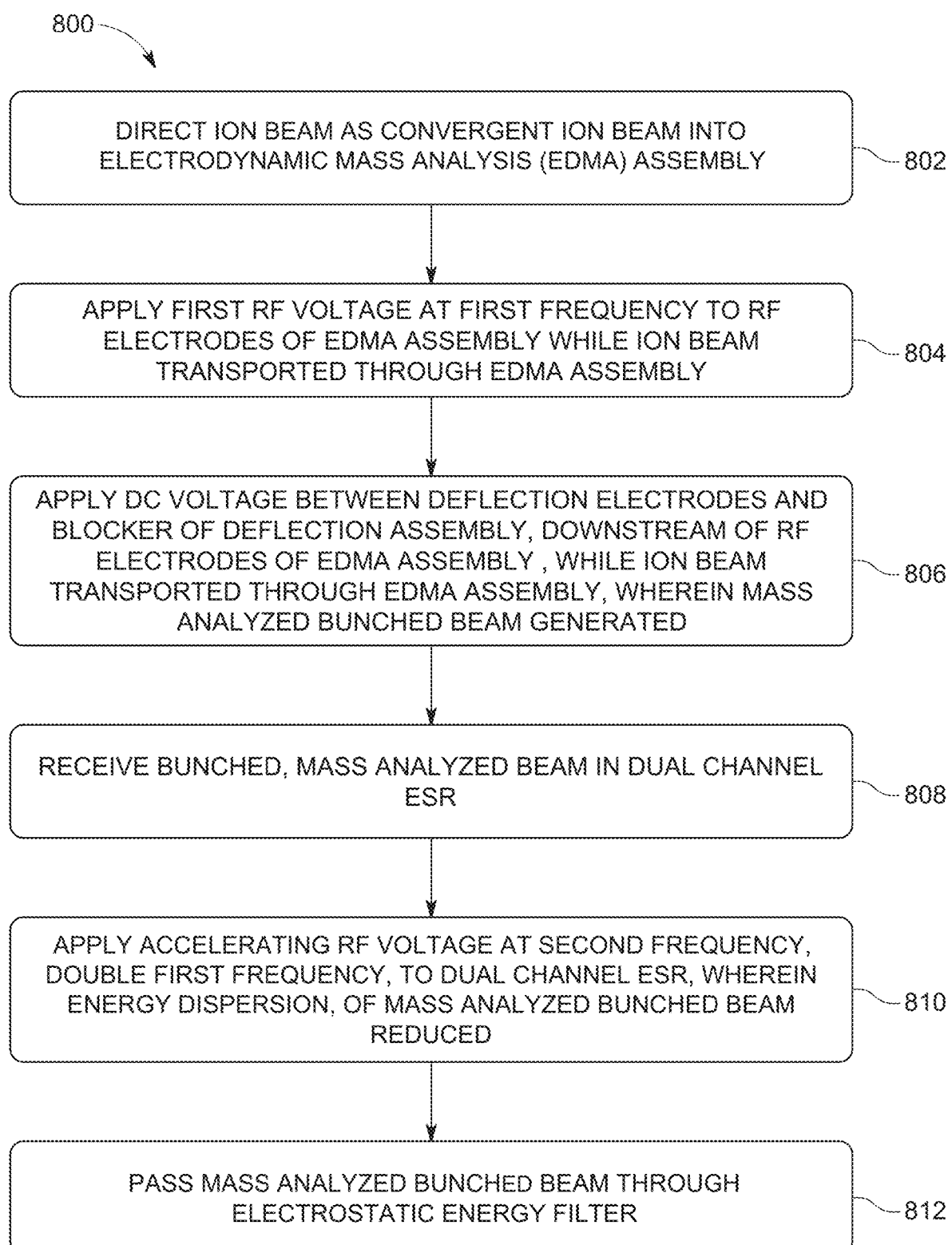

DIRECT ION BEAM AS CONVERGENT ION BEAM INTO ELECTRODYNAMIC MASS ANALYSIS (EDMA) ASSEMBLY — 802

APPLY FIRST RF VOLTAGE AT FIRST FREQUENCY TO RF ELECTRODES OF EDMA ASSEMBLY WHILE ION BEAM TRANSPORTED THROUGH EDMA ASSEMBLY — 804

APPLY DC VOLTAGE BETWEEN DEFLECTION ELECTRODES AND BLOCKER OF DEFLECTION ASSEMBLY, DOWNSTREAM OF RF ELECTRODES OF EDMA ASSEMBLY , WHILE ION BEAM TRANSPORTED THROUGH EDMA ASSEMBLY, WHEREIN MASS ANALYZED BUNCHED BEAM GENERATED — 806

RECEIVE BUNCHED, MASS ANALYZED BEAM IN DUAL CHANNEL ESR — 808

APPLY ACCELERATING RF VOLTAGE AT SECOND FREQUENCY, DOUBLE FIRST FREQUENCY, TO DUAL CHANNEL ESR, WHEREIN ENERGY DISPERSION, OF MASS ANALYZED BUNCHED BEAM REDUCED — 810

PASS MASS ANALYZED BUNCHED BEAM THROUGH ELECTROSTATIC ENERGY FILTER — 812

FIG. 8

HYBRID APPARATUS, SYSTEM AND TECHNIQUES FOR MASS ANALYZED ION BEAM

FIELD OF THE DISCLOSURE

The disclosure relates generally to ion beam apparatus and more particularly to ion implanters having mass analysis.

BACKGROUND OF THE DISCLOSURE

Ion implantation is a process of introducing dopants or impurities into a substrate via bombardment. Ion implantation systems ("ion implanters") may comprise an ion source and a substrate stage or process chamber, housing a substrate to be implanted. The ion source may comprise a chamber where ions are generated. Beamline ion implanters may include a series of beam-line components, for example, a mass analyzer, a collimator, and various components to accelerate or decelerate the ion beam.

A useful function of an ion implanter beamline is to separate ions of different masses so that an ion beam may be formed having the desired ions for treating the work piece or substrate, while undesirable ions are intercepted in a beam-line component and do not reach the substrate. In known systems, this mass analysis function is provided by an analyzing magnet, which component bends a beam of ions that all have the same energy in a curve whose radius depends on the ion mass, thus achieving the required separation. Magnets of this kind, however, are large, expensive and heavy and represent a significant fraction of the cost and power consumption of an ion implanter.

For relatively lower energy ion implantation, such as energy below approximately 50 keV, compact ion beam systems have been developed. These ion beam systems may include a plasma chamber acting as ion source, and placed adjacent a process chamber, housing the substrate to be implanted. An ion beam may be extracted from the plasma chamber using an extraction grid or other extraction optics to provide an ion beam to the substrate, with a desired beam shape, such as a ribbon beam. In these latter systems, mass analysis may be omitted because of size/space considerations for installing a magnetic analyzer, as discussed above, as well as cost. Thus, the use of such compact ion beam systems may be limited to applications where purity of implanting species is not a strict requirement.

Recently, an approach for ion beam processing system has been proposed, wherein an electrodynamic mass analysis (EDMA) component is used to generate a mass analyzed ion beam in a more compact ion beam processing apparatus. This approach applies a high frequency field to filter out ions of unwanted mass. However, EDMA designs conceived of to date may not generate acceptably high flux for ions of the targeted mass, especially when operating at high overall beam current. In addition, such EDMA designs may generate an unacceptably wide spread of ion energies for the mass analyzed ion beam.

With respect to these and other considerations, the present disclosure is provided.

BRIEF SUMMARY

In one embodiment, an apparatus is provided, including an electrodynamic mass analysis (EDMA) assembly. The EDMA assembly may include a first upper electrode, disposed above a beam axis; and a first lower electrode, disposed below the beam axis, opposite the first upper electrode, the EDMA assembly arranged to receive a first RF voltage signal at a first frequency. The apparatus may include a deflection assembly, disposed downstream to the EDMA assembly, the deflection assembly comprising a blocker, disposed along the beam axis. The apparatus may include an energy spread reducer (ESR), disposed downstream to the deflection assembly, the energy spread reducer arranged to receive a second RF voltage signal at a second frequency, twice the first frequency. The ESR may include an upper ESR electrode, disposed above the beam axis; and a lower ESR electrode, disposed below the beam axis.

In another embodiment, an ion beam processing system may include an ion source, to generate an ion beam as a continuous ion beam and an electrodynamic mass analysis (EDMA) assembly, disposed downstream of the ion source. The EDMA assembly may include a first upper electrode, disposed above a beam axis; and a first lower electrode, disposed below the beam axis, opposite the first upper electrode, where the EDMA assembly is arranged to receive a first RF voltage signal at a first frequency. The ion beam processing system may include a deflection assembly, disposed downstream to the EDMA assembly, the deflection assembly comprising a blocker, disposed along the beam axis; and an energy spread reducer (ESR), disposed downstream to the deflection assembly. The ESR may be arranged to receive a second RF voltage signal at a second frequency, twice the first frequency, where the energy spread reducer includes an upper ESR electrode, disposed above the beam axis; and a lower ESR electrode, disposed below the beam axis.

In another embodiment, a method may include directing an ion beam as a continuous ion beam into an EDMA assembly, comprising a first upper electrode and a first lower electrode. The method may include applying a first RF voltage signal applied at a first frequency to the ion beam in the EDMA assembly, while the ion beam is transported through EDMA assembly. The method may further include blocking a path of a portion of the ion beam along the beam axis at a position downstream to the EDMA assembly, using a blocker, wherein a mass analyzed bunched ion beam is generated. The method may also include applying an accelerating RF voltage signal to the mass analyzed bunched ion beam as the bunched ion beam passes through an energy spread reducer, wherein the accelerating RF voltage signal is applied at a second frequency, twice the first frequency.

BRIEF DESCRIPTION OF THE DRAWINGS

FIG. 8 depicts an exemplary process flow according to some embodiments of the disclosure.

Figure 1A:
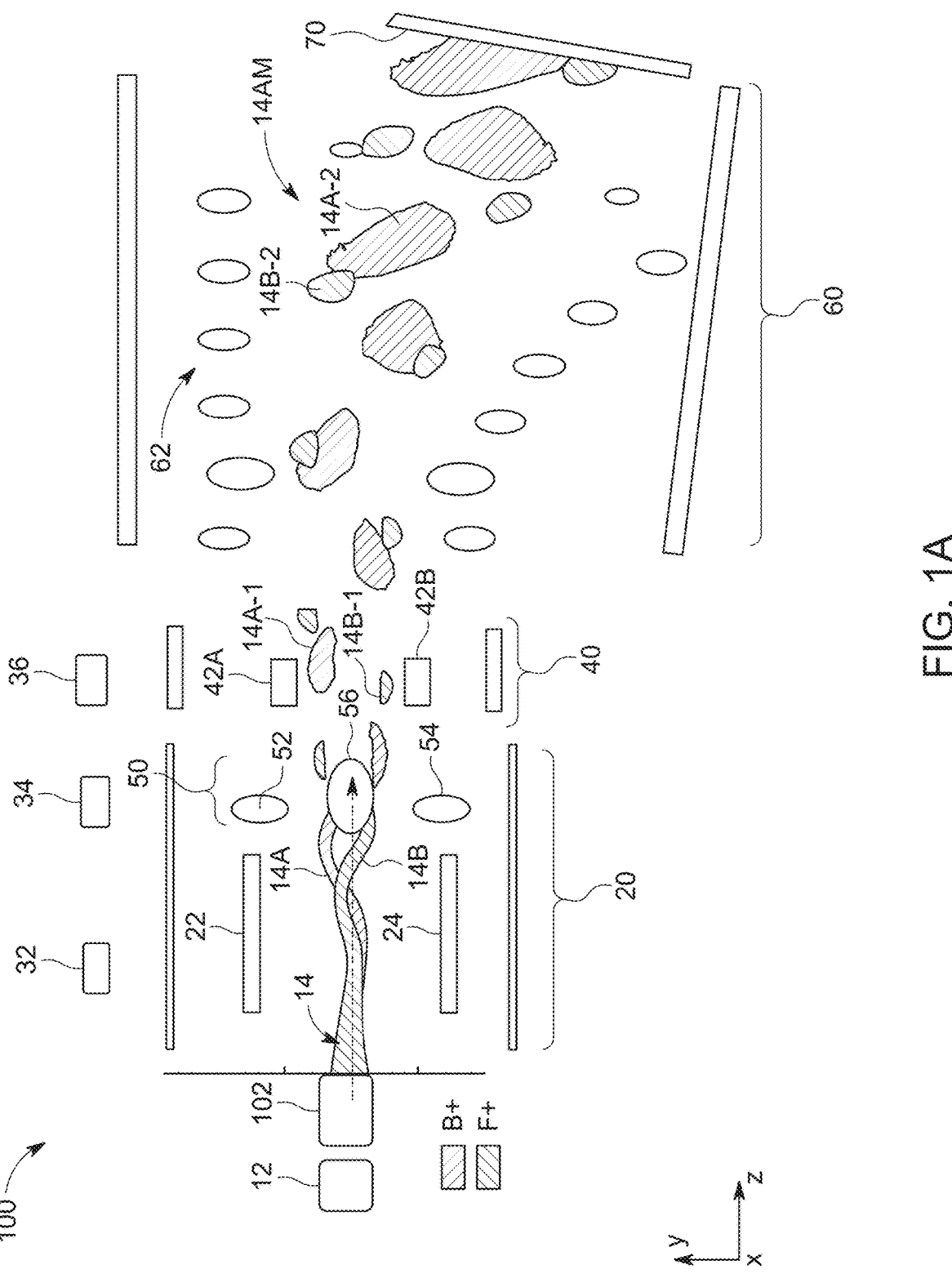
FIG. 1A shows an exemplary system, according to embodiments of the disclosure.

The drawings are not necessarily to scale. The drawings are merely representations, not intended to portray specific parameters of the disclosure. The drawings are intended to depict exemplary embodiments of the disclosure, and therefore are not considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not to be construed as being limited to the embodiments set forth herein. Instead, these embodiments are provided so this disclosure will be thorough and complete, and will fully convey the scope of the system and method to those skilled in the art.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for mass analyzed ion implantation systems, using a novel mass analysis device. In various embodiments the mass analysis device may be implemented in beamline ion implanters or in compact ion beam systems.

FIG. 1A shows an ion beam processing system 100, according to various embodiments of the disclosure. The ion beam processing system 100 includes an ion source 12, to generate an ion beam 14 as a continuous ion beam, an EDMA assembly 20, disposed to receive the ion beam 14, and generate a mass analyzed ion beam, as well as an electrostatic energy filter, shown as energy filter 60, arranged to generate an energy filtered, mass analyzed ion beam shown as ion beam 14AM, that is directed to a substrate 70. The structure and operation of an electrostatic energy filter is well known, so details of the electrostatic energy filter 60 will be omitted herein. The basic operation of such an energy filter employs a set of electrodes 62 that are disposed around an ion beam path, that apply a series of targeted DC (static) voltages to deflect an ion beam, as well as accelerate and/or decelerate the ion beam. In so doing, the electric fields generated in the electrostatic energy filter 60 will filter out ion species and energetic neutral species having an unwanted energy, different than a targeted energy or targeted range of energies. The general function of the EDMA assembly 20 is to filter out ions of unwanted mass and to transmit ions of a targeted mass into the energy filter 60.

According to various embodiments of the disclosure, the EDMA assembly 20 may receive the ion beam 14 as a continuous ion beam. In some embodiments, the ion beam processing system 100 will also include a convergent ion beam assembly 102, where the operation of a convergent ion beam assembly is detailed below. As received, the ion beam 14 may have a trajectory along a beam axis, meaning along the z-axis in the Cartesian coordinate system shown. In the example of FIG. 1A, the beam axis may lie between the first upper electrode 22 and the first lower electrode 24, and in some embodiments may lie in the middle of the EDMA assembly, such as midway between the first upper electrode 22 and the first lower electrode 24, as indicated by the dashed line. The EDMA assembly 20 may include an EDMA power supply 32 to apply a first RF signal between a first upper electrode 22 and a first lower electrode 24. In particular, the RF signal between the first upper electrode 22 and first lower electrode 24 may be delivered so that the phase of the RF signal at the upper electrode is 180 degrees out of phase with respect to the phase of the RF signal at the first lower electrode 24.

In various non-limiting embodiments, suitable frequencies for RF signals of the present disclosure may be in the range of 200 kHz to 100 MHz. As detailed in the discussion to follow, the first RF signal will deflect the ion beam 14 in a manner that aids in mass filtering.

The EDMA assembly 20 may further include a deflection assembly 50, disposed downstream to the EDMA assembly 20, where the deflection assembly 50 includes a blocker 56, disposed along the beam axis. In some embodiments, the deflection assembly 50 may include an upper deflection electrode 52, disposed on a first side of the blocker 56, and a lower deflection electrode 54, disposed on a second side of the blocker 56, as well as a deflection power supply 34, arranged to apply a static bias voltage between the blocker 56 on the one hand and the upper deflection electrode 52, and lower deflection electrode 54 on the other hand. Note that for clarity of illustration, in FIG. 1A and other figures certain walls are omitted that form part of the EDMA assembly 20 or similar EDMA apparatus.

As further depicted in FIG. 1A, the ion beam processing system 100 may also include an energy spread reducer 40, disposed downstream to the deflection assembly 50. The energy spread reducer (ESR) 40 may include a ESR power supply 36, arranged to deliver to the electrodes of the ESR 40, a second RF voltage signal at a second frequency, twice the first frequency of the EDMA assembly 20. In the embodiment of FIG. 1A, the ESR 40 includes an upper ESR electrode 42A, disposed above the beam axis, and a lower ESR electrode 42B, disposed below the beam axis, that will receive simultaneously the second RF signal at the same amplitude and phase.

In some embodiments, the electrodes of the EDMA assembly 20 and ESR 40 are elongated along an electrode axis (represented by the x-axis) where the electrode axis extends perpendicularly to the beam axis. This configuration may be especially suitable for treating ribbon beams, where the ribbon beam is characterized by a long axis in cross-section extending along the x-axis. However, in other embodiments the electrodes of the EDMA assembly 20 and ESR 40 may be shaped to treat a spot or pencil beam having a more equiaxed shape in cross-section.

As illustrated in FIG. 1A, in operation, the EDMA assembly 20 may perform a mass filtering operation on the ion beam 14 by deflecting constituent ions of the ion beam 14 along different trajectories, so as to intercept ions whose mass does not correspond to the targeted ion mass, while transmitting ions of the targeted mass to the energy filter 60. The ions of the ion beam portion 14A are then passed through the electrostatic energy filter 60 before striking the substrate 70. As an example, the ion beam 14 may represent a boron ion beam having a large portion of B$^+$ ions where the ion beam 14 may include other constituent ions, generally considered to be impurity ions, such as F$^+$, BF$^+$, and BF$_2^+$.

In particular, when an RF field is generated between the first upper electrode 22 and first lower electrode 24, the frequency of the RF voltage signal generating the RF field may be chosen according to the energy of the ions of ion beam 14, as well as the masses of the constituent ions. By choosing an appropriate frequency as well as a maximum amplitude of the RF voltage, ions that are to be filtered out may be deflected onto trajectories that are intercepted by the surfaces of various components within the EDMA assembly 20. For clarity of explanation, in the illustration of FIG. 1A, just an ion beam portion 14A is shown, representing B$^+$ ions, and an ion beam portion 14B, representing F$^+$ ions. However, depending upon the type of ion source and species provided to the ion source 12, other ion species may be present in a boron ion beam as entering the EDMA assembly 20. As shown, these portions may propagate through the EDMA assembly, having different spatial distributions that are a result of the different masses of B$^+$ and F$^+$. By choosing the proper frequency and amplitude of the RF signal applied to the EDMA assembly 20, the ion beam portion 14A may be deflected in a manner that tends to guide a relatively greater fraction of the ion beam portion 14A through the EDMA assembly 20 and to the substrate 70, in comparison to the ion beam portion 14B.

In particular, as ions traverse the region between blocker 56 and upper deflection electrode 52 or lower deflection electrode 54, a DC voltage may be applied between the blocker 56, which component may be grounded, and the upper deflection electrode 52 and lower deflection electrode 54. This DC voltage may be set to filter out ions of unwanted mass and to provide the necessary deflection for desired ion species to reduce or eliminate mean vertical velocity for the ion bunches, such as bunches 14A-1 as the bunches exit the EDMA assembly.

As further shown in FIG. 1A, by blocking a path of a portion of the ion beam 14 that lies near to or along the beam axis at a position downstream to the EDMA electrodes, using the blocker 56, in addition to a mass filtering, a bunching of ions in the ion beam 14 takes place, so that the ion beam 14 exits the EDMA assembly 20 as a mass analyzed bunched ion beam. As an example, the bunches 14A-1 and bunches 14A-2 may represent B$^+$ ions having the targeted mass for ion implantation. The bunches 14B-1 and bunches 14B-2 may represent F$^+$ ions. As illustrated in FIG. 1A, while the F$^+$ ions as represented by ion beam portion 14B may constitute a relatively larger fraction of ions in the ion beam 14 upon entering the EDMA assembly, the bunches 14B-1 constitute a relatively smaller portion of ions exiting the EDMA assembly as compared to the bunches 14A-1, representative of B$^+$ ions.

In operation, when the ion beam 14 traverses the EDMA assembly 20, a certain energy spread, or energy dispersion, will be imparted into the ion beam 14. This energy spread may take place along the direction of beam propagation, such as generally along the z-axis, as well as an energy spread along the Y axis. For instance, a B$^+$ ion beam having a nominal energy of 20 keV, may exhibit an energy spread of 3 keV to 6 keV after exiting the EDMA assembly 20, in accordance with some non-limiting embodiments.

According to embodiments of the present disclosure, the ESR 40 will reduce the energy spread of ions in ion beam 14 by applying an RF field at the electrodes of ESR 40 in order to selectively accelerate or decelerate ions in a given ion bunch, such as a bunch 14A-1. In particular, as the ions of a bunch 14A-1 enter the ESR 40, an RF voltage signal may be applied at twice the frequency of the RF voltage signal used in the EDMA assembly 20. As noted, the ions of the bunch 14A-1 may have a range of ion energies, such as between 17 keV and 23 keV for a nominal ion energy of 20 keV. The distribution of ions within a bunch 14A-1 may correlate with the ion energy of those ions, so that slower ions tend to be positioned to the upstream side (left in the figure), while faster (higher energy) ions are positioned to the downstream side (right). Because the RF voltage signal is being applied between the upper ESR electrode 42A and the lower ESR electrode 42B, an oscillating electric field (not shown) at RF frequency will be generated in the space traversed by the bunch 14A-1. This electric field will tend to accelerate or decelerate the bunches 14A-1 during traversal of the ESR 40. Because the slower ions will enter the ESR 40 at a different instance than the faster ions, the magnitude of the accelerating/decelerating electric field within the ESR 40 that is experienced by the leading ions (faster ions) will in general be different from the magnitude of the accelerating/decelerating electric field experienced by the lagging ions (slower ions). With suitable timing, taking into account the energy of the ions of incoming bunches, such as bunches 14A-1, as well as the phase of the RF signal applied to the EDMA assembly 20, the RF voltage signal may be delivered to the ESR 40 in a manner that tends to slow the leading ions (faster ions) and speed up the lagging ions (slower ions). As a result, the energy spread in bunches of the ion beam 14 may be reduced by the ESR 40.

While the ion beam processing system 100 provides a compact approach to generate a mass analyzed ion beam, having an acceptable energy dispersion, the yield of ions of a targeted mass that is output to the substrate 70 may be relatively low for a given application. In order to properly operate the ESR 40, a length of a B$^+$ bunch, such as bunch 14A-1, in the ion beam 14 should ideally be equal to the quantity: (¼ of the B$^+$ ion velocity)×1 RF period of the EDMA assembly 20. Such a requirement may place a limit for "ideal" B$^+$ transmission to ~50%, meaning the magnitude of the current of a beam output by the ESR 40 would equal to 50% of the magnitude of the current input into the EDMA assembly 20.

Returning to the convergent ion beam assembly 102, this component may aid in controlling space charge effects that tend to cause beam blow up, especially in cases where the current density for ion beam 14 is relatively higher. The present inventors have found for computer simulation of relatively higher current B$^+$ ion beams, including BF$^+$ and BF$_2^+$ species, a relatively pronounced beam potential may develop in the center of the EDMA assembly 20, due to space charge effects from the heavier species, such as BF$^+$ and BF$_2^+$ ions. This potential tends to drive ions including B$^+$ ions into trajectories that are not compensated for, such that the B$^+$ ions, instead of steering around the blocker 56 and exiting the EDMA assembly 20, may be driven into walls or other surfaces inside the EDMA assembly 20. By directing the ion beam 14 as a convergent ion beam, the space charge effects tending to blow up the ion beam 14 may be compensated for, allowing a greater fraction of the ions of a targeted mass, such as $B^+$, to propagate through the EDMA assembly 20, leading to a higher yield.

Figure 7B:
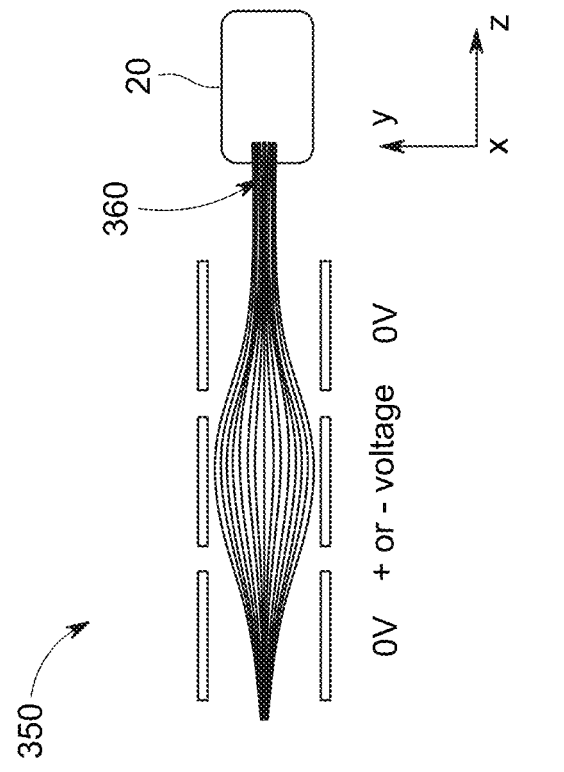
FIG. 7B shows another embodiment of a convergent ion beam assembly.
Figure 7A:
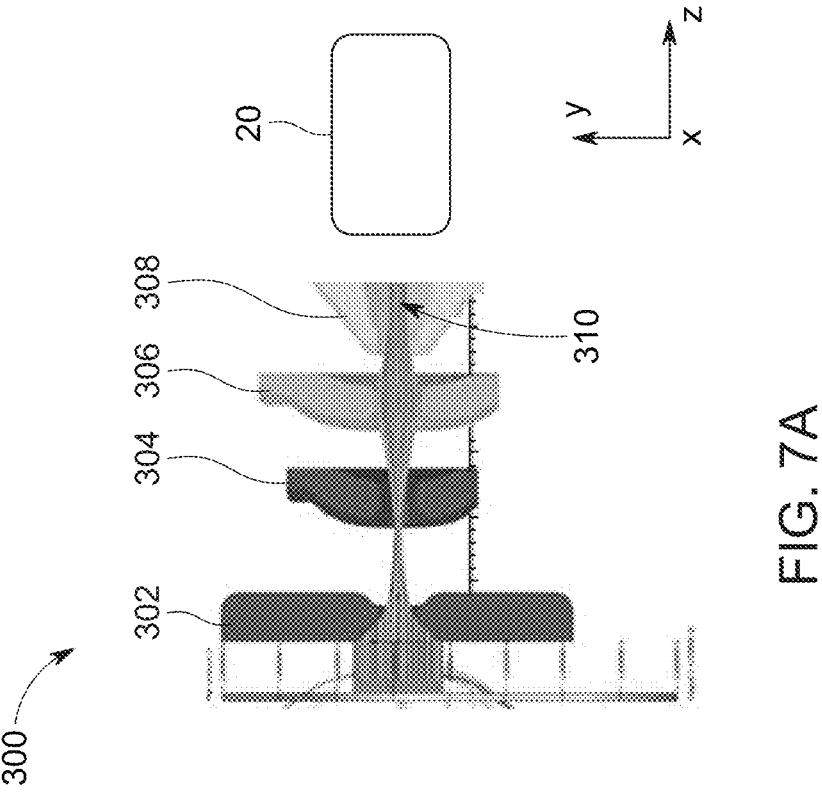
FIG. 7A illustrates one particular embodiment of a convergent ion beam assembly.

FIG. 7A illustrates one particular embodiment of a convergent ion beam assembly 300, formed from a tetrode assembly. The tetrode assembly may include a first electrode 302, such as a plate of an ion source, which plate is biased at final beam energy. A suppression electrode 304 is biased negatively with respect to the first electrode 302 in order to extract an ion beam. A 'defocusing' electrode 306 is biased positively with respect to the suppression electrode 304 to slow down the ion beam and increase the beam vertical size, and a 'ground' electrode 308 is provided at beamline potential to generate a convergent ion beam 310 entering an EDMA assembly 20.

Note, this configuration is different from known tetrode extraction assemblies, where a defocusing electrode, analogous to defocusing electrode 306 is kept negative with respect to the beamline to keep a beamline neutralized. However, such neutralization is not the necessary for operation of the EDMA assembly 20.

In another embodiment, shown in FIG. 7B, a convergent ion beam assembly 350 may be configured as an Einzel lens, with three sets of electrodes as shown, where the middle electrode is biased with respect to the first electrode and the last electrode, in order to generate a convergent ion beam 360.

Figure 1B:
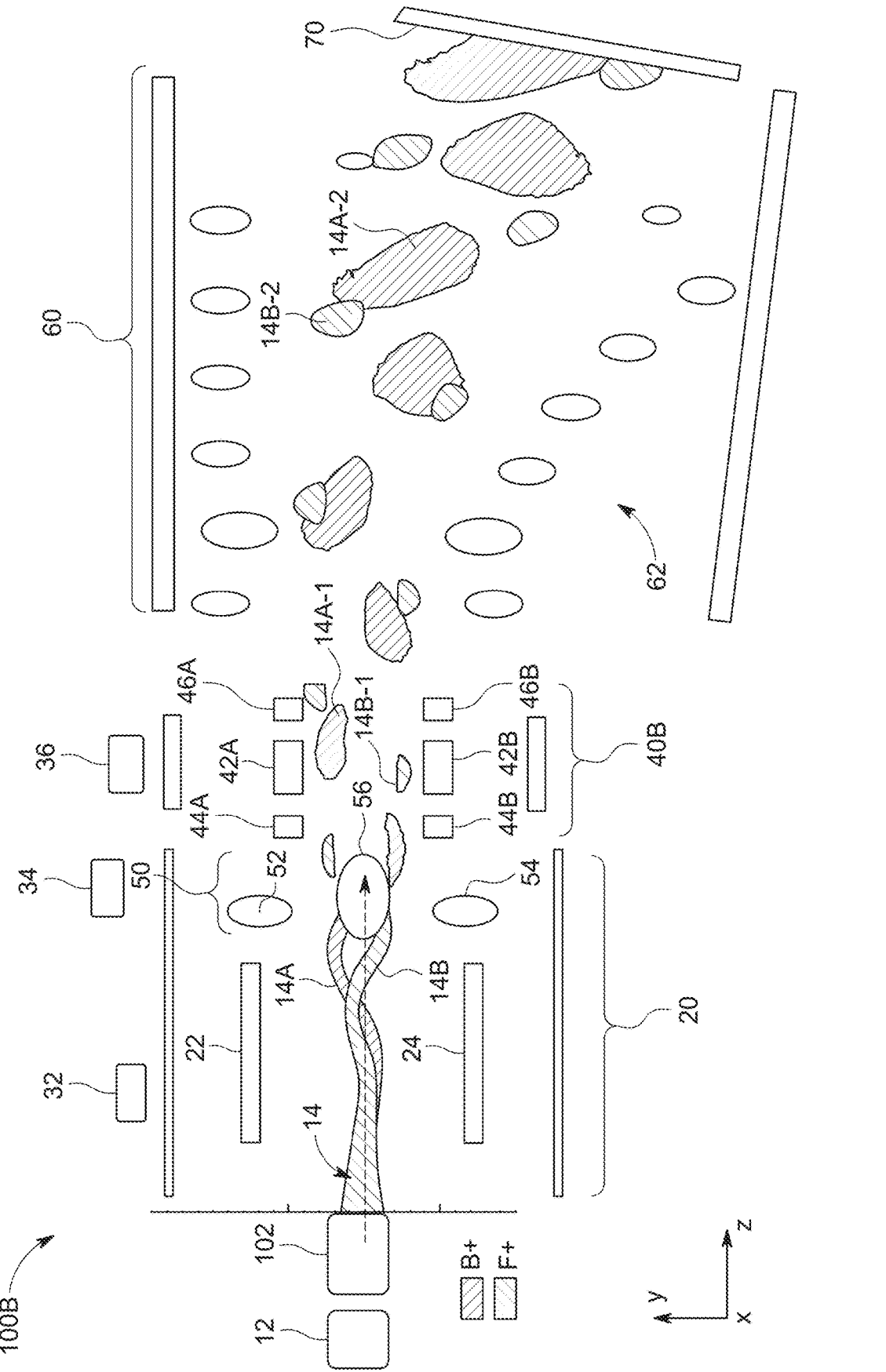
FIG. 1B shows another exemplary system, according to embodiments of the disclosure.

FIG. 1B depicts an ion beam processing system 100B, arranged according to additional embodiments of the disclosure. The ion beam processing system 100B may be deemed to be a variant of the ion beam processing system 100, where like elements are labeled the same. The ion beam processing system 100B differs from the ion beam processing system 100 in the configuration of a ESR. In this embodiment, the ESR 40B includes a set of DC electrodes that are coupled to be set at beamline potential. These DC electrodes may include a first set, electrode 44A, electrode 44B, disposed upstream of the upper ESR electrode 42A and lower ESR electrode 42B, as shown. These DC electrodes may also include a second set, electrode 46A, electrode 46B, disposed downstream of the upper ESR electrode 42A and lower ESR electrode 42B, as shown. The advantage of the ESR 40B is that the provision of the DC electrodes that tend to generate electric fields in the direction of beam propagation in the ESR 40B that extend more closely parallel to the z-axis and provide a more uniform field in a direction perpendicular to the direction of travel of an ion bunch along the z-axis. This more uniform z-axis field in Y direction will tend to more properly reduce the energy spread of an ion bunch traversing the ESR 40B (see FIG. 2A, below).

Figure 1C:
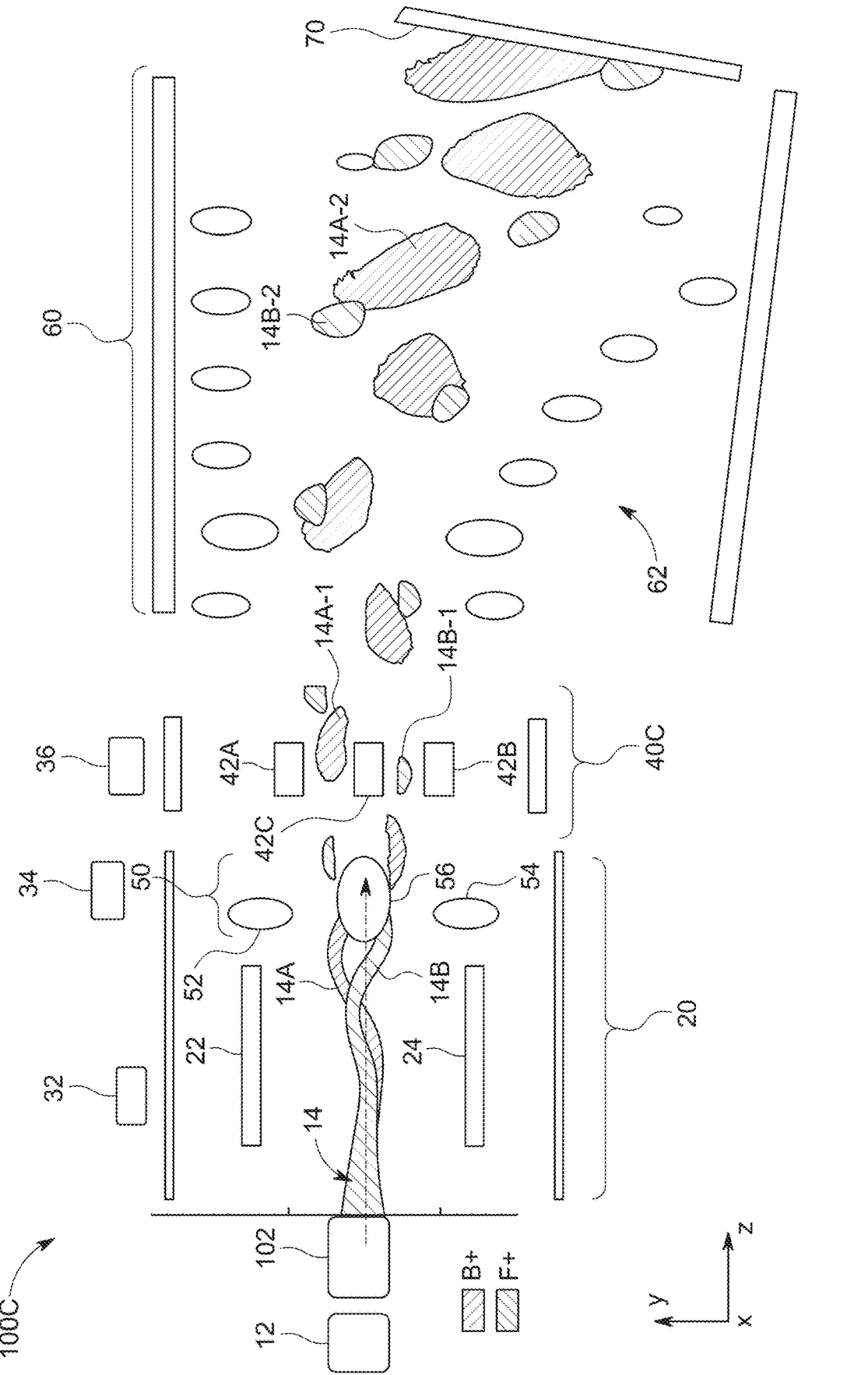
FIG. 1C shows a further exemplary system, according to embodiments of the disclosure.

FIG. 1C depicts an ion beam processing system 100C, arranged according to additional embodiments of the disclosure. The ion beam processing system 100C may be deemed to be a variant of the ion beam processing system 100, where like elements are labeled the same. The ion beam processing system 100C differs from the ion beam processing system 100 in the configuration of an ESR. In this embodiment, the ESR 40C includes a middle ESR electrode 42C, disposed between the upper ESR electrode 42A and the lower ESR electrode 42B, wherein the upper ESR electrode 42A, the middle ESR electrode 42C, and the lower ESR electrode 42B form a dual channel ESR. The advantage of the ESR 40C is that the provision of the middle ESR electrode 42C will tend to generate electric fields that extend more closely parallel to the z-axis and provide a more uniform field in a direction perpendicular to the direction of travel of an ion bunch along the z-axis. This more uniform z-axis field in Y-direction will tend to more properly reduce the energy spread of an ion bunch traversing the ESR 40C (see FIG. 2A, below).

Figure 1D:
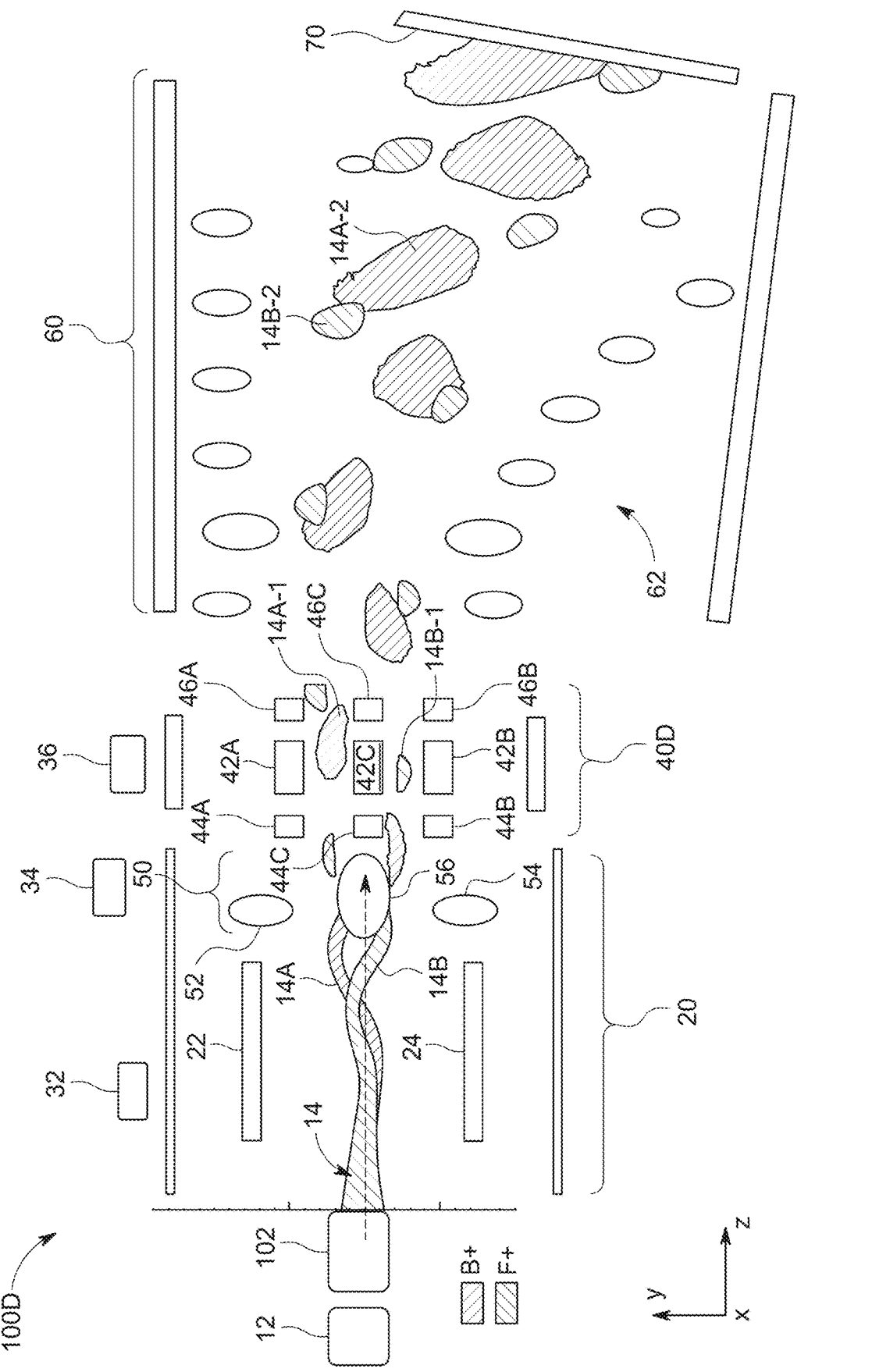
FIG. 1D shows an additional exemplary system, according to embodiments of the disclosure.

FIG. 1D depicts an ion beam processing system 100D, arranged according to additional embodiments of the disclosure. The ion beam processing system 100D may be deemed to be a variant of the ion beam processing system 100, where like elements are labeled the same. The ion beam processing system 100D differs from the ion beam processing system 100 in the configuration of an ESR. In this embodiment, the ESR 40D includes a middle ESR electrode 42C, disposed between the upper ESR electrode 42A and the lower ESR electrode 42B, wherein the upper ESR electrode 42A, the middle ESR electrode 42C, and the lower ESR electrode 42B form a dual channel ESR. The ESR 40D may further include optional DC electrodes that are coupled to be set at beamline potential. These DC electrodes may include a first set, electrode 44A, electrode 44B, and electrode 44C, disposed upstream of the upper ESR electrode 42A and lower ESR electrode 42B, as shown. These DC electrodes may also include a second set, electrode 46A, electrode 46B, and electrode 46C, disposed downstream of the upper ESR electrode 42A and lower ESR electrode 42B, as shown. The advantage of the ESR 40D is that the provision of the middle ESR electrode 42C tends to generate electric fields that extend more closely parallel to the z-axis and therefore provide a more uniform field in a direction perpendicular to the direction of travel of an ion bunch along the z-axis. This more uniform z-axis field in Y-direction will tend to more properly reduce the energy spread of an ion bunch traversing the ESR 40D. In addition, the provision of the DC electrodes (44A-44C and 46A) further provides regions tending to generate electric fields along the y-axis (see FIG. 2A, below).

Figures 2A, 2B:
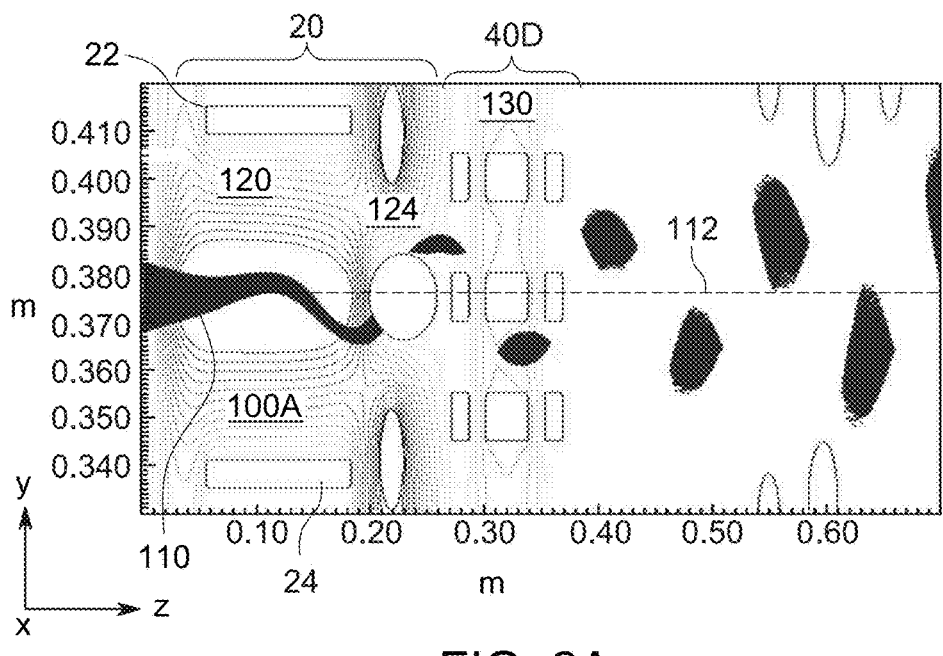
FIG. 2A shows the transport of a target ion species according to one scenario for operating the apparatus of FIG. 1D, according to other embodiments of the disclosure.
FIG. 2B depicts an exemplary energy profile of an ion beam treated in the apparatus of FIG. 2A.

Turning to FIG. 2A there is shown a computer simulation of electric fields and ion beam position in the ion beam processing system 100D, under one scenario of operation. In this example, a 18 mA boron beam is input at an energy of 21 keV, with a 3 kV RF maximum amplitude voltage signal is applied at a first frequency to the first upper electrode 22 and the first lower electrode 24 of the EDMA assembly 20. With reference also to FIG. 1B, a DC deflection voltage of 1500 V is applied between the blocker 56 on the one hand, and the upper deflection electrode 52 and lower deflection electrode 54 on the other hand. A double frequency RF voltage signal having a maximum amplitude of 500 V is applied to the ESR 40D at twice the frequency of the first RF signal applied to the first upper electrode 22 and the first lower electrode 24. In addition, the double frequency RF voltage signal at the ESR 40D is shifted by 300 degrees with respect to the phase of the first RF voltage signal at the EDMA assembly 20.

As illustrated in FIG. 2A, an electric field 120 develops between the first upper electrode 22 and first lower electrode 24, which field is represented by horizontal electric potential lines. The electric field 120 oscillates at the RF frequency of the applied voltage signal, while generally imparting a velocity component to the ion beam 110 in the Y-direction, so that the ion beam 110 may exhibit a wavelike character. When the ion beam 110 interacts with the blocker 56 of the deflection assembly 50, for any given period of the RF electric field 120 (360 degrees), the blocker 56 will effectively generate two separate ion bunches that pass through the deflection assembly 50 and ESR 40D.

A DC electric field 124, generated by the deflection assembly 50, is somewhat more complex in shape, while tending to deflect a positive ion beam, such as ion beam 110, inwardly toward the beam axis 112. The ESR 40D generates an energy spread reducing (ESR) electric field 130 at twice the frequency of the RF electric field 120, having field lines generally shaped as a vertical field as shown, meaning along the y-axis. Because two separate ion bunches will pass through the ESR 40D in a single period of the RF electric field 120, the ESR electric field 130, by having a period half the duration of the RF electric field 120, will oscillate in a manner to treat both ion bunches similarly as the ion bunches travel sequentially through the ESR 40D.

As a result, after the ion beam 110 is deflected, bunched, and accelerated through the ion beam processing system 100A, a $B^+$ current yield of approximately 35% (6 mA) is realized at the substrate, with an energy spread as shown in FIG. 2B. All other species (e.g., $BF^+$, $BF_2^+$) are blocked from reaching the substrate 70, except for a small portion of $F^+$.

Turning to FIG. 2B, there is shown a an ion energy distribution function, corresponding to the conditions as outlined above for the scenario of FIG. 2A. The ion current distribution is characterized by a peak having a full width at half maximum of 50 eV and a total energy spread of 400 eV.

Figure 2C:
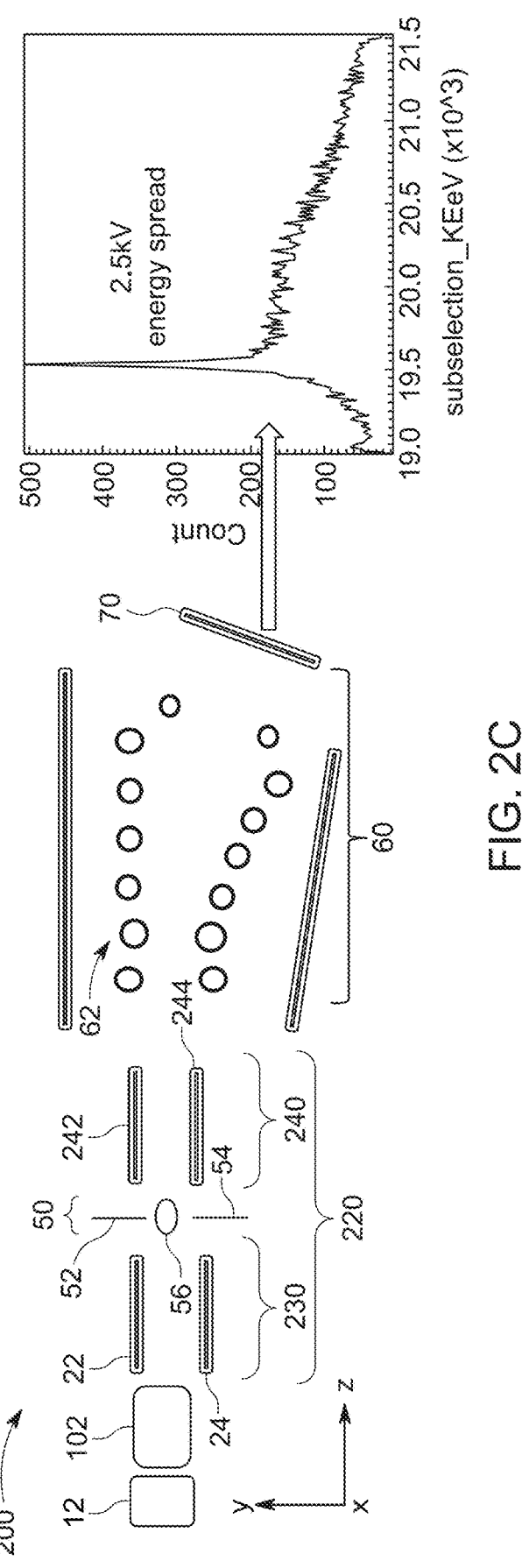
FIG. 2C shows an apparatus without an ESR, and an exemplary energy profile of an ion beam treated in the apparatus of FIG. 2C.

Note that apparatus is contemplated where, instead of a ESR, a second 'stage' of an EDMA assembly may be placed downstream of the deflection assembly 50. This configuration is illustrated in FIG. 2C, where an ion beam processing system 200 is shown, with like components labeled the same as those in the aforementioned embodiments. In this embodiment, the ESR 40 is removed and replaced by a second set of RF electrodes, shown as second upper electrode 242 and second lower electrode 244. This embodiment functions as a two stage EDMA assembly 220, where the first stage 230 may act similarly to the EDMA assembly 20. The second stage 240 will apply a similar RF field as the first stage 230, with a result that effective mass filtering of unwanted masses (e.g, $F^+$, $BF^+$, and $BF_2^+$) may be achieved, as well as a current yield of up to 50% in the case of $B^+$. An issue with the ion beam processing system 200 is that, lacking a ESR 40 or ESR 40D, the energy spread of an analyzed ion beam may be unduly broad. This issue is highlighted in the graph of FIG. 2C, illustrating a beam energy profile for a nominally 20 keV beam, generated by the ion beam processing system 200, where the total energy spread is 2.5 keV.

Figure 3A:
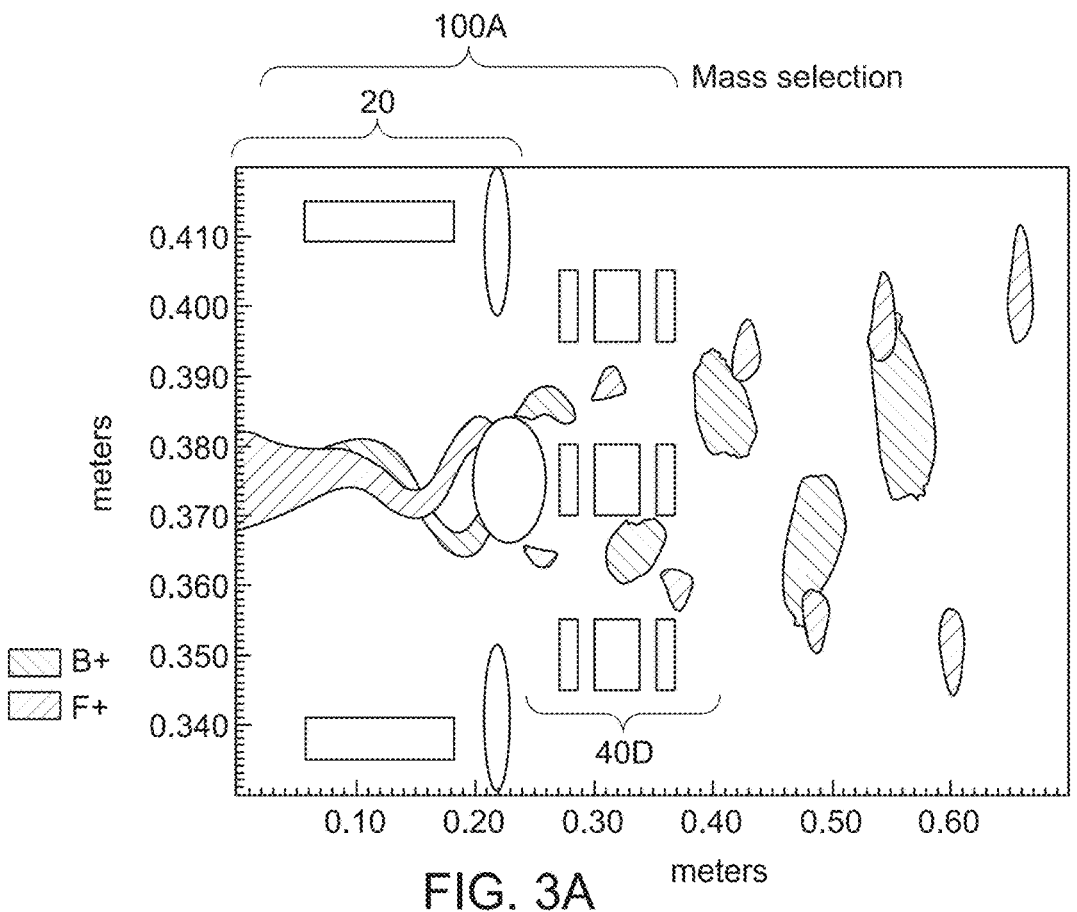
FIGS. 3A-3C illustrate the operation of an apparatus under one scenario, according to an embodiment of the disclosure.
Figure 3B:
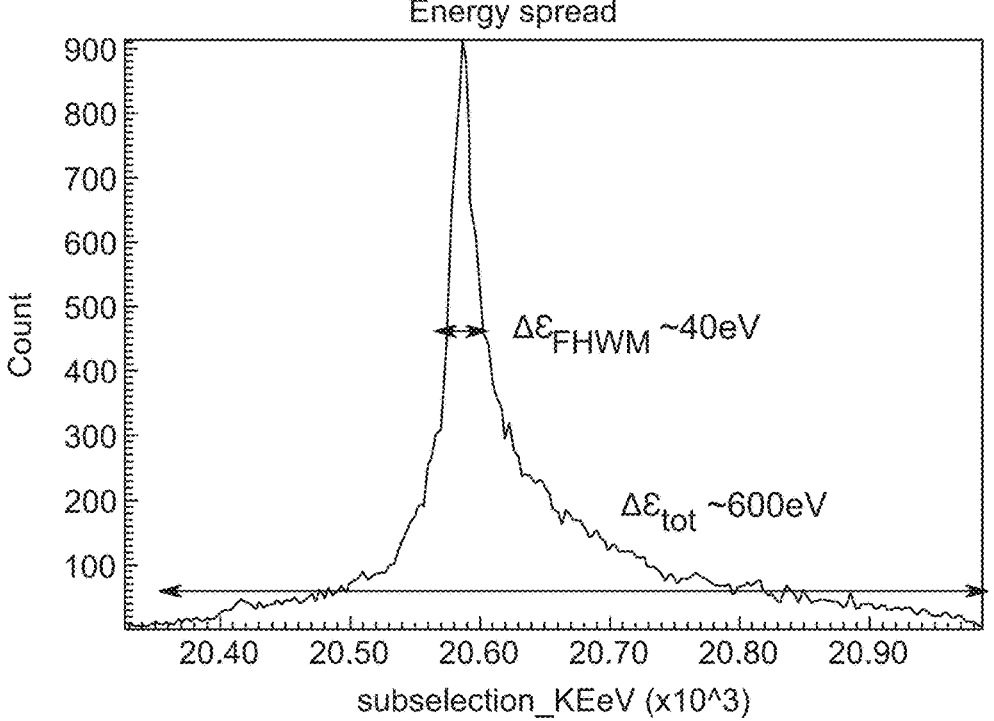
Figure 3C:
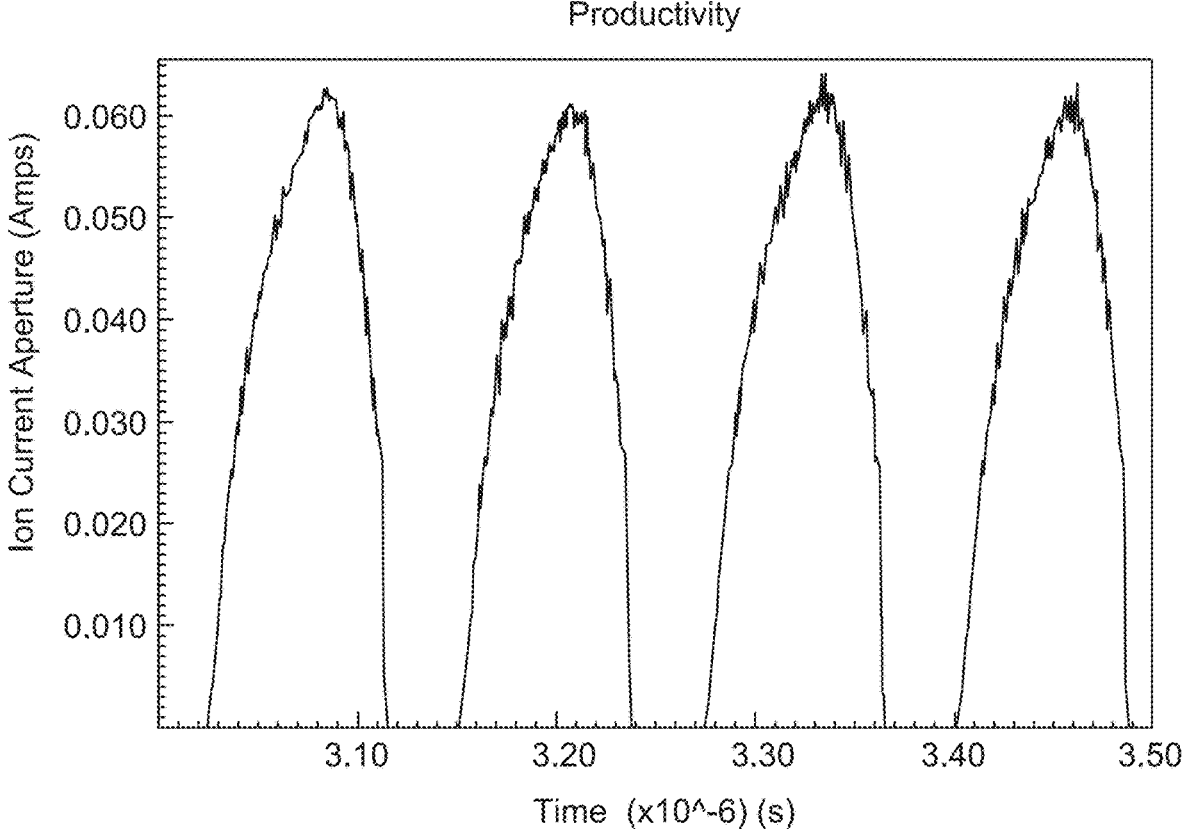

Turning to FIG. 3A there is shown another scenario for operation of the ion beam processing system 100A. In this example, a 18 mA boron beam is input at an energy of 21 keV, with a 3.5 kV RF maximum amplitude voltage signal that is applied at a first frequency to the first upper electrode 22 and the first lower electrode 24 of the EDMA assembly 20. With reference also to FIG. 1B, a positive voltage of +400 V is applied to the upper deflection electrode 52 and lower deflection electrode 54, while the blocker 56 is biased at −400 V. A double frequency RF voltage signal having a maximum amplitude of 400 V is applied to the ESR 40D at twice the frequency of the first RF signal applied to the first upper electrode 22 and the first lower electrode 24. In addition, the double frequency RF voltage signal at the ESR 40D is shifted by 300 degrees with respect to the phase of the first RF voltage signal at the EDMA assembly 20. Under these conditions, the output $B^+$ current is 9 mA, corresponding to a yield or transmission of ~50%. The current at the substrate is shown as a function of time in FIG. 3C, exhibiting a series of regular peaks corresponding to the ion bunches that are separated in time according to the frequency of the RF voltage applied in the ion beam processing system 100A. As shown in FIG. 3B, the ion current distribution is characterized by a peak having a full width at half maximum of 40 eV and a total energy spread of 600 eV. Thus, modification of voltage amplitude in the RF electrodes of the EDMA assembly 20, as well as the DC voltage at the deflection assembly 50 may improve the transmission of ions of the targeted species. As illustrated in FIG. 3A, a portion of $F^+$ ions is not filtered and may strike the substrate 70.

Figure 4:
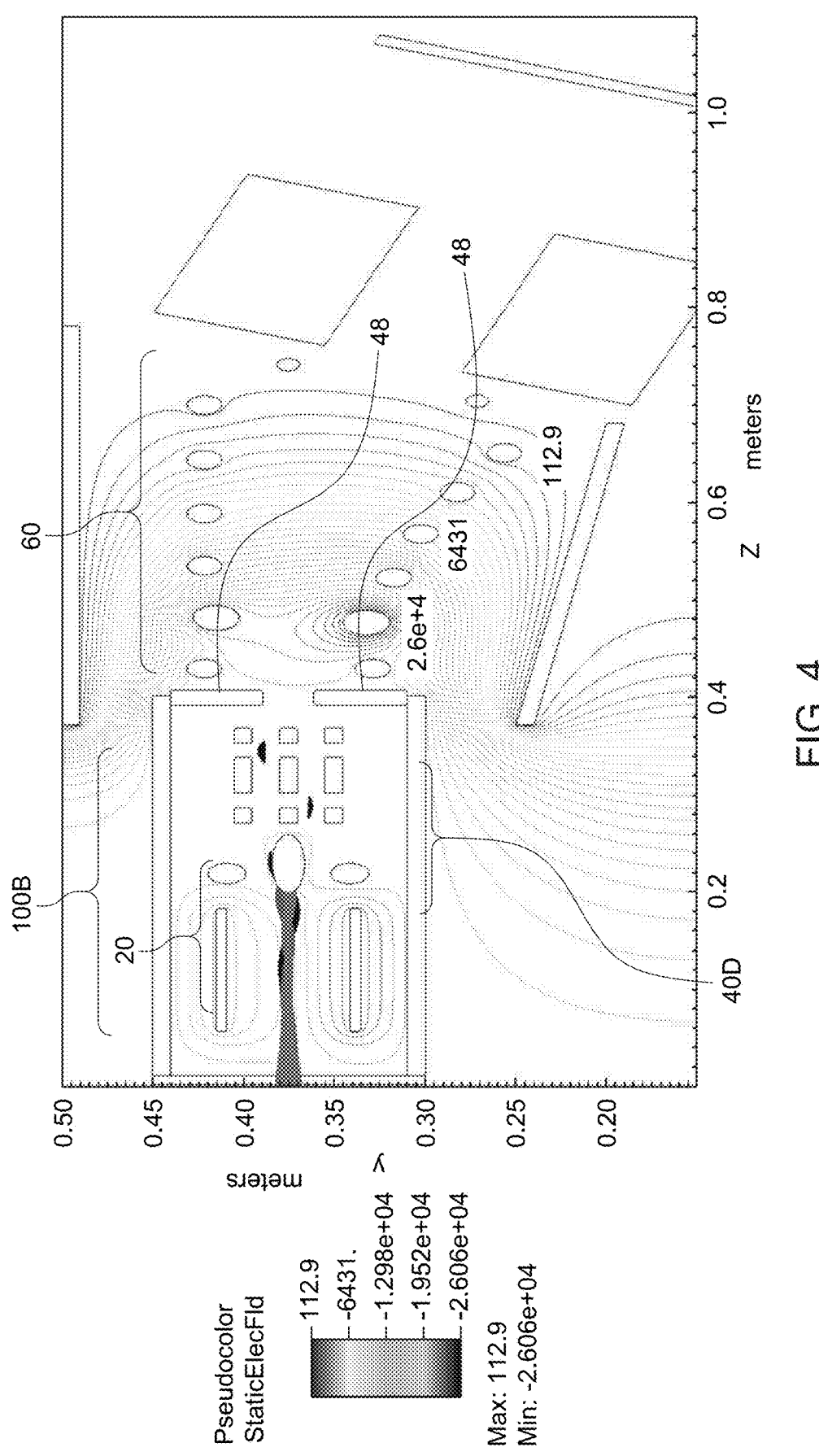
FIG. 4 illustrate an embodiment of operation of another apparatus under another scenario, according to other embodiments of the disclosure.

Turning to FIG. 4 there is shown another scenario for operation of another ion beam processing system, in accordance with further embodiments of the disclosure. The ion beam processing system 100B, as shown, may include the same components as discussed previously with respect to ion beam processing system 100A. In addition, the ion beam processing system 100B includes a blocking aperture, shown as an aperture component 48, disposed downstream of the ESR 40D. In this example, a 18 mA boron beam is input at an energy of 21 keV, with a 3.5 kV RF maximum amplitude voltage signal is applied at a first frequency to the first upper electrode 22 and the first lower electrode 24 of the EDMA assembly 20. With reference also to FIG. 1B, a positive voltage of +400 V is applied to the upper deflection electrode 52 and lower deflection electrode 54, while the blocker 56 is biased at −400 V. A double frequency RF voltage signal having a maximum amplitude of 400 V is applied to the ESR 40D at twice the frequency of the first RF signal applied to the first upper electrode 22 and the first lower electrode 24. In addition, the double frequency RF voltage signal at the ESR 40D is shifted by 300 degrees with respect to the phase of the first RF voltage signal at the EDMA assembly 20. The beam is then decelerated to ~700 eV energy using EPM 60. Under these conditions, the output $B^+$ current is ~7 mA, corresponding to a yield or transmission of ~ 40%. Thus, modification of voltage amplitude in the RF electrodes of the EDMA assembly 20, as well as the DC voltage at the deflection assembly 50 may improve the transmission of ions of the targeted species and filter out undesired species. In this configuration, all $F^+$, $BF^+$, $BF_2^+$ ions are filtered out.

Figures 5A, 5B:
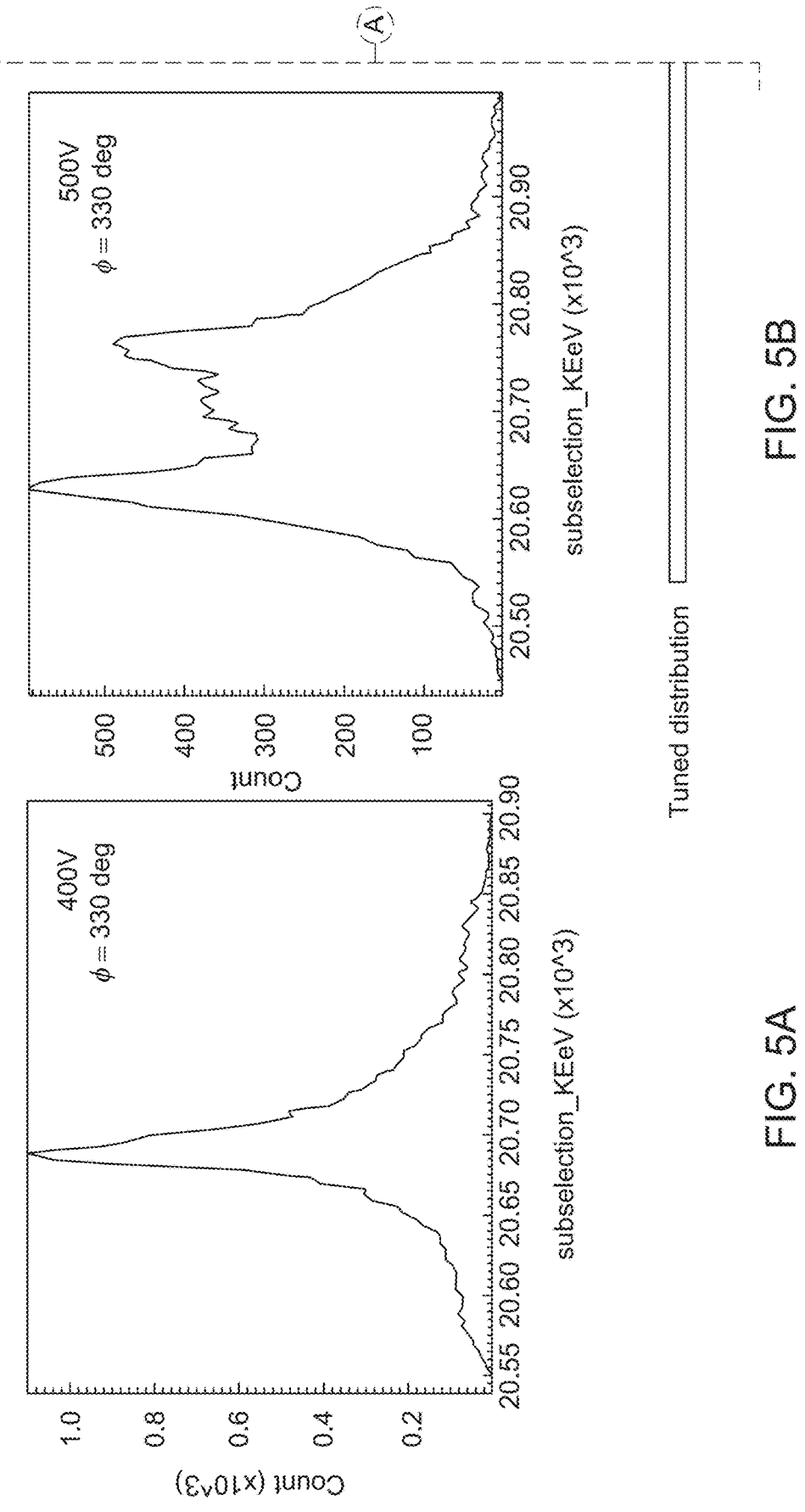
FIGS. 5A-5D shows energy profile tuning of an ion beam using voltage control of RF voltage in an ESR, in an apparatus arranged according to embodiments of the disclosure.
Figures 5C, 5D:
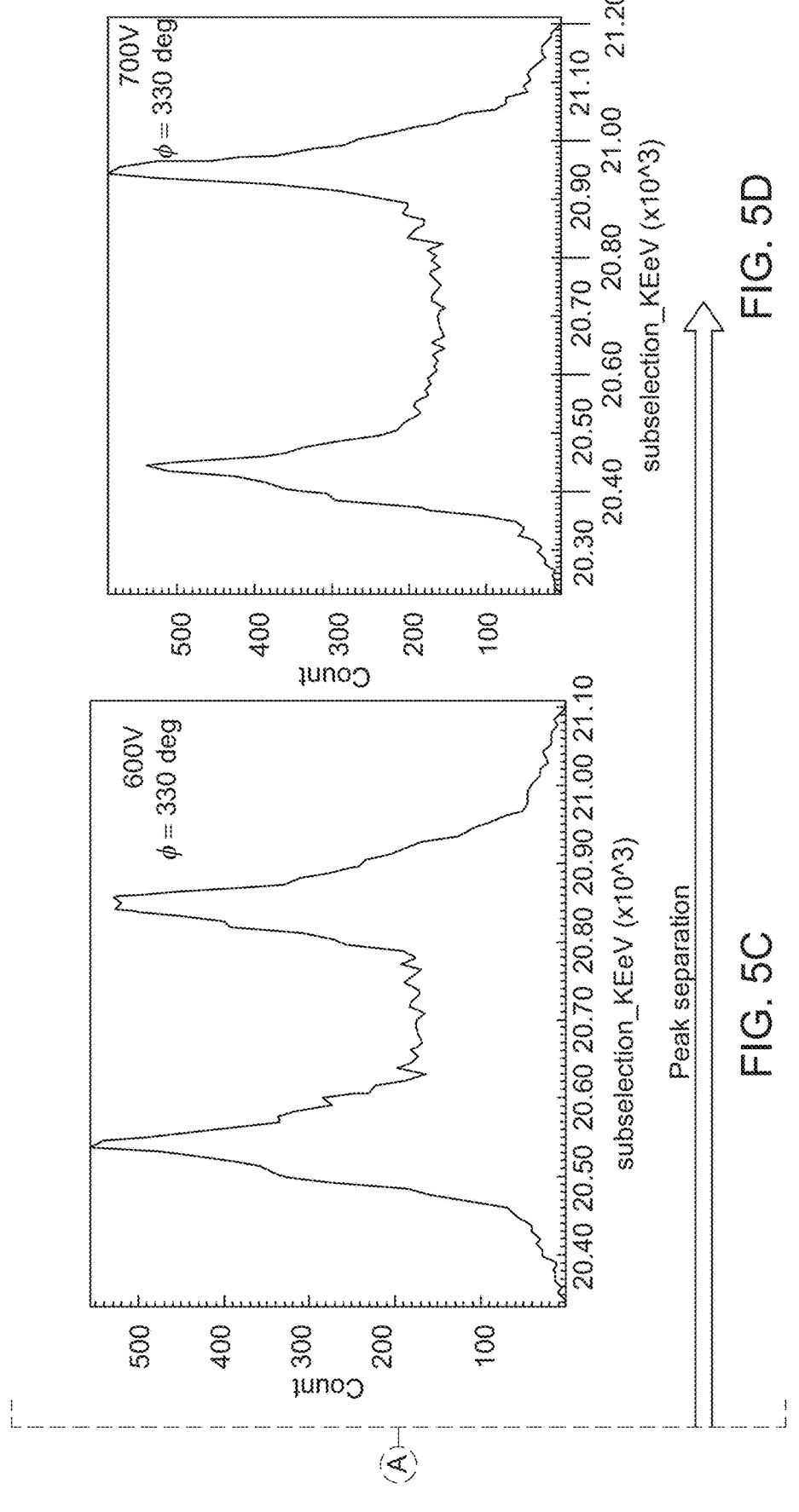
Figures 6A, 6B:
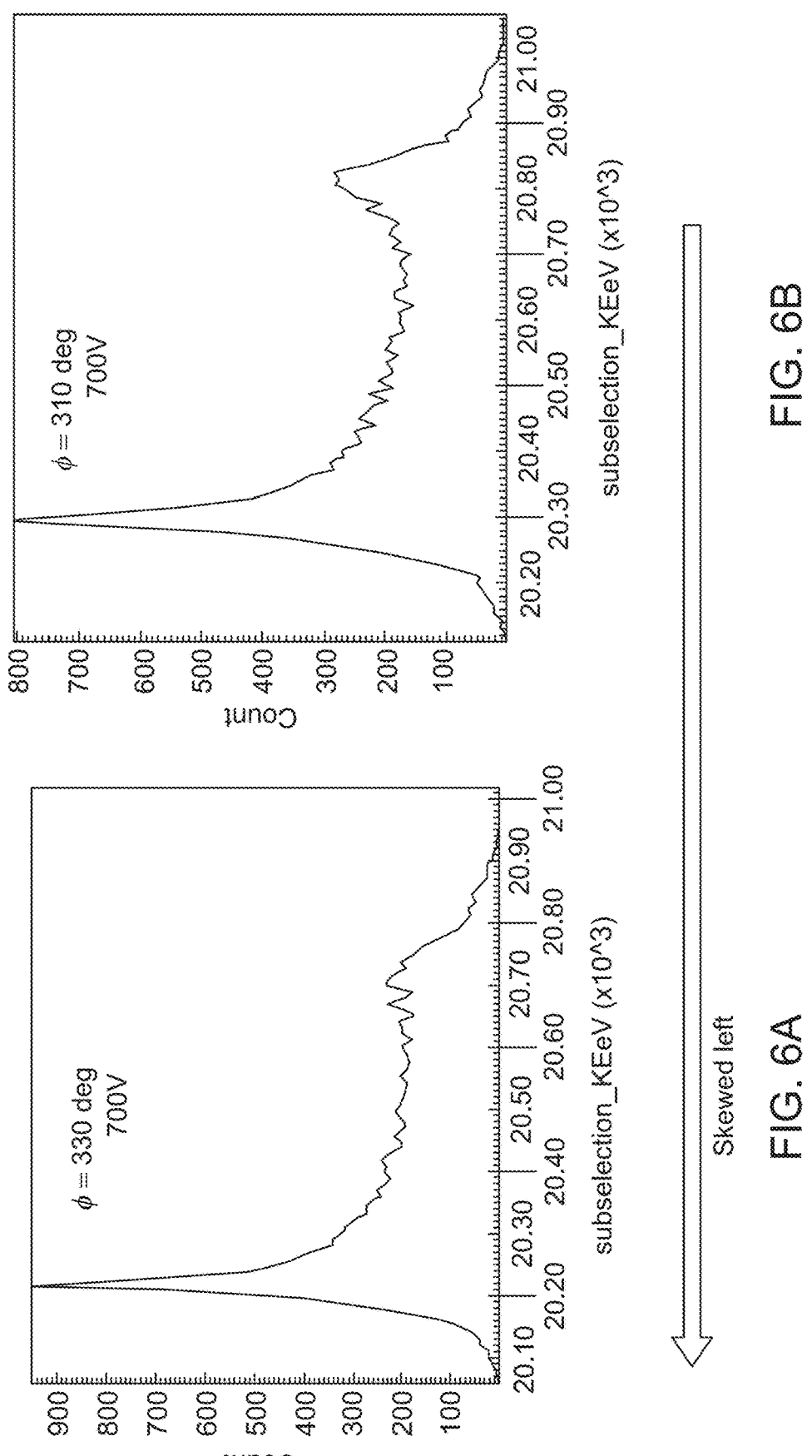
FIGS. 6A-6D shows energy profile tuning of an ion beam using phase control of RF voltage in an ESR, in an apparatus arranged according to embodiments of the disclosure.
Figures 6C, 6D:
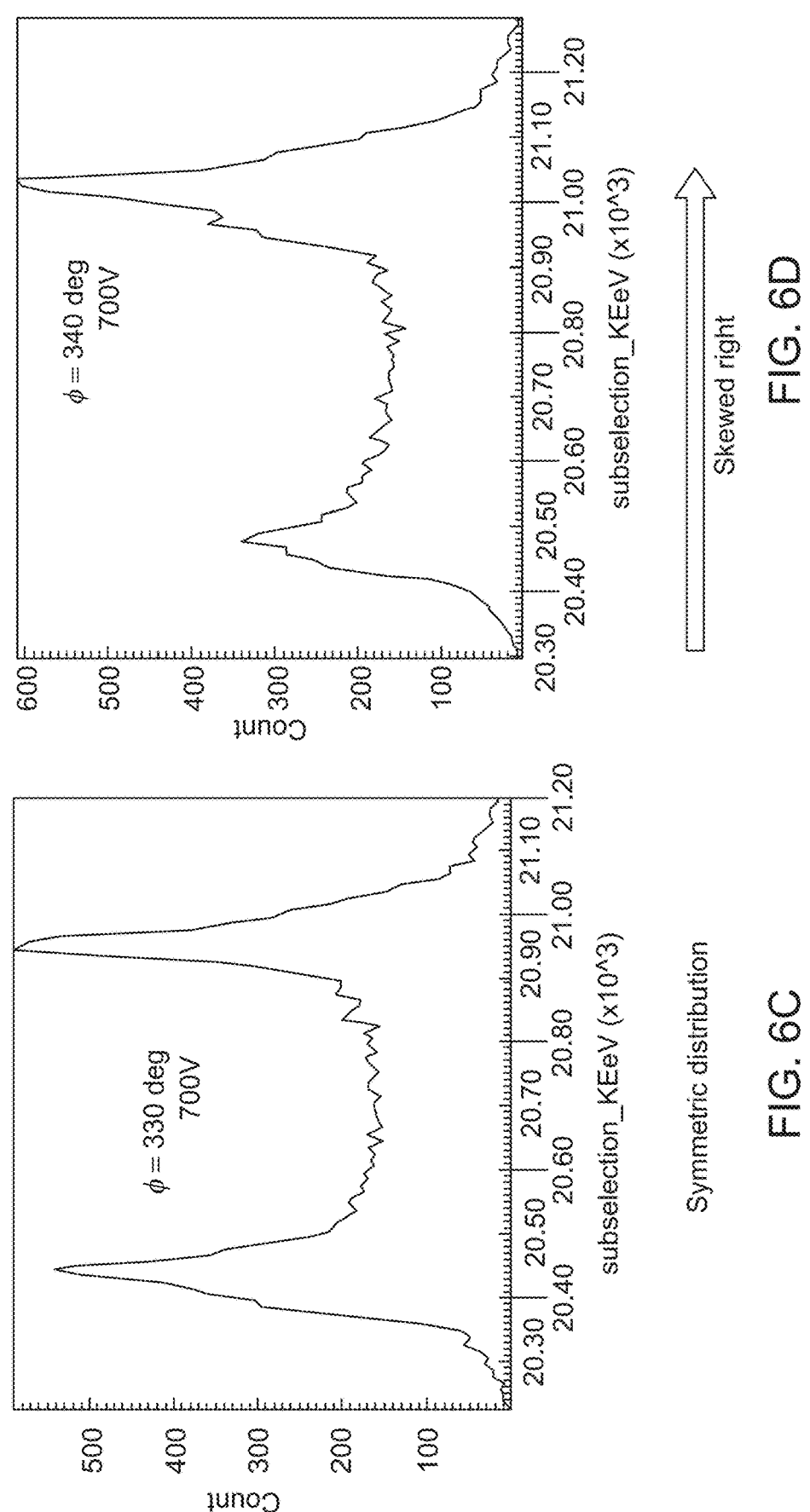

As discussed previously with respect to FIG. 2B, a ESR, such as ESR 40 or ESR 40D may be employed to reduce energy spread for an ion beam that is output by an EDMA assembly according to the present embodiments. According to further embodiments of the disclosure, the operating parameters of an ion beam processing system, including an EDMA assembly and ESR, may be adjusted to tailor the ion beam energy profile, according to a targeted application. FIGS. 5A-5D present a series of ion beam energy profiles for a boron ion beam that are generated by a variant of the ion beam processing apparatus, where the maximum amplitude of the RF voltage applied to the ESR is varied. For each ion beam energy profile, the phase difference between the RF voltage applied to the EDMA assembly and the accelerating RF voltage applied to the ESR is 330 degrees. FIG. 5A corresponds to 400 V, FIG. 5B corresponds to 500 V, FIG. 5C corresponds to 600 V, and FIG. 5D corresponds to 700 V. The nominal energy of the boron ion beam entering the ESR in all these examples is 21 keV. As shown in FIG. 5A, at 400 V setting, the ESR RF voltage is effective to generate a very narrow energy distribution, as discussed previously. At 500 V, the energy spread is much wider, with a bimodal distribution, showing two, partially separated peaks whose energy differs by 150 eV. At 600 V, a clear bimodal distribution of energy is shown with two symmetrical peaks separated by approximately 300 eV. At 700 V, a bimodal distribution is still present with a peak separation of ~500 eV.

In view of the above, the RF voltage amplitude may be adjusted to tailor an energy distribution, to provide a range of ion implantation profiles for implanting ions. In other approaches, the tailoring of beam energy profiles may be used to mimic ion distributions that are used for etching processes.

According to further embodiments of the disclosure, the operating parameters of an FIGS. 6A-6D present a series of ion beam energy profiles for a boron ion beam that are generated by a variant of the ion beam processing apparatus, where the maximum amplitude of the RF voltage applied to the ESR is varied. For each profile, the RF voltage applied to the ESR is 700 V, while the phase difference varies between 300 and 340 degrees. In each of these examples, there is a bimodal distribution of ion energies, with a peak separation of approximately 500 eV. A difference is that the distribution of beam current as a function of ion energy is systematically shifted from low energy to high energy as the phase shift increases.

FIG. 8 depicts a process flow 800, according to embodiments of the disclosure. At block 802, an ion beam is directed as a convergent ion beam into an electrodynamic mass analysis (EDMA) assembly.

At block 804, a first RF signal is applied at a first RF voltage and a first frequency to RF electrodes of the EDMA assembly. The RF electrodes of the EDMA assembly may include a first upper electrode and a first lower electrode that are configured to receive an RF signal, where the phase of the RF signal at the first upper electrode is 180 degrees shifted from the phase of the RF signal at the first lower electrode. At block 806, a DC voltage is applied between deflection electrodes and blocker of a deflection assembly that is located downstream of the RF electrodes. The DC voltage is applied while the ion beam is transported through the EDMA assembly so as to deflect and intercept different ion species of the ion beam, wherein a mass analyzed bunched beam is generated. In particular, the blocker may intercept the ion beam in a manner that tends to create a bunched ion beam, while the DC volage, in conjunction with the RF voltage applied at the RF electrodes, will deflect ions having different masses differently, so that ions of a desired species and having a targeted mass pass preferentially through the EDMA assembly.

At block 808, the bunched, mass analyzed ion beam is received in a dual channel ESR, where the dual channel ESR includes an upper ESR electrode and a lower ESR electrode, as well as a middle ESR electrode.

At block 810 an accelerating RF voltage is applied at a second frequency, double the first frequency, to the dual channel ESR, wherein the energy dispersion of the mass analyzed bunched beam is reduced.

At block 812, the mass analyzed bunched beam is passed through an electrostatic energy filter before striking a substrate.

The present embodiments provide a first advantage of a reduced footprint for generating a mass analyzed ion beam as opposed to known beamline ion implanters, using an EDMA assembly and deflection assembly. A further advantage provided by the present embodiments is the ability to generate a reduced energy spread of a mass analyzed ion beam in a compact ion beam system, by virtue of the ESR assembly.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An apparatus, comprising:
an electrodynamic mass analysis (EDMA) assembly comprising:
  a first upper electrode, disposed above a beam axis; and
  a first lower electrode, disposed below the beam axis, opposite the first upper electrode, the EDMA assembly arranged to receive a first RF voltage signal at a first frequency;
a deflection assembly, disposed downstream to the EDMA assembly, the deflection assembly comprising a blocker, disposed along the beam axis; and
an energy spread reducer (ESR), disposed downstream to the deflection assembly, the energy spread reducer arranged to receive a second RF voltage signal at a second frequency, twice the first frequency, the energy spread reducer comprising:
  an upper ESR electrode, disposed above the beam axis; and
  a lower ESR electrode, disposed below the beam axis.

2. The apparatus of claim 1, the energy spread reducer further comprising a middle ESR electrode, disposed between the upper ESR electrode and the lower ESR electrode, wherein the upper ESR electrode, the middle ESR electrode and the lower ESR electrode form a dual channel ESR.

3. The apparatus of claim 1, the deflection assembly further comprising an upper deflection electrode, disposed on a first side of the blocker, and a lower deflection electrode, disposed on a second side of the blocker.

4. The apparatus of claim 1, further comprising a convergent ion beam assembly, disposed upstream of the EDMA assembly.

5. The apparatus of claim 4, wherein the convergent ion beam assembly comprises an Einzel lens.

6. The apparatus of claim 4, wherein the convergent ion beam assembly comprises a tetrode assembly, wherein a third electrode of the tetrode assembly is biased positively.

7. The apparatus of claim 1, further comprising a blocking aperture, disposed downstream to the energy spread reducer.

8. An ion beam processing system, comprising:
an ion source, to generate an ion beam as a continuous ion beam;
an electrodynamic mass analysis (EDMA) assembly, disposed downstream of the ion source, and comprising:
  a first upper electrode, disposed above a beam axis; and
  a first lower electrode, disposed below the beam axis, opposite the first upper electrode, the EDMA assembly arranged to receive a first RF voltage signal at a first frequency;
a deflection assembly, disposed downstream to the EDMA assembly, the deflection assembly comprising a blocker, disposed along the beam axis; and
an energy spread reducer (ESR), disposed downstream to the deflection assembly, the ESR arranged to receive a second RF voltage signal at a second frequency, twice the first frequency, the energy spread reducer comprising:
  an upper ESR electrode, disposed above the beam axis; and
  a lower ESR electrode, disposed below the beam axis.

9. The ion beam processing system of claim 8, further comprising:
  an EDMA power supply, arranged to apply the first RF voltage signal between the first upper electrode and the first lower electrode;
  a deflection power supply, arranged to apply a static bias voltage between the blocker and the deflection assembly; and
  an ESR power supply, arranged to apply the second RF voltage signal.

10. The ion beam processing system of claim 8, the energy spread reducer further comprising a middle ESR electrode, disposed between the upper ESR electrode and the lower ESR electrode, wherein the upper ESR electrode, the middle ESR electrode and the lower ESR electrode form a dual channel ESR.

11. The ion beam processing system of claim 8, further comprising a convergent ion beam assembly, disposed upstream of the EDMA assembly.

12. The ion beam processing system of claim 11, wherein the convergent ion beam assembly comprises an Einzel lens.

13. The ion beam processing system of claim 11, wherein the convergent ion beam assembly comprises a tetrode assembly, wherein a third electrode of the tetrode assembly is biased positively.

14. The ion beam processing system of claim 8, further comprising an electrostatic energy filter, arranged downstream to the EDMA assembly, and comprising a plurality of electrodes to alter a direction of propagation of the ion beam, wherein the plurality of electrodes are positioned asymmetrically about the beam axis.

15. A method, comprising:
  directing an ion beam as a continuous ion beam into an EDMA assembly, comprising a first upper electrode and a first lower electrode;

applying a first RF voltage signal applied at a first frequency to the ion beam in the EDMA assembly, while the ion beam is transported through the EDMA assembly;
  blocking a path of a portion of the ion beam along a beam axis at a position downstream to the EDMA assembly, using a blocker, wherein a mass analyzed bunched ion beam is generated; and
  applying an accelerating RF voltage signal to the mass analyzed bunched ion beam as the mass analyzed bunched ion beam passes through an energy spread reducer, wherein the accelerating RF voltage signal is applied at a second frequency, twice the first frequency.

16. The method of claim 15, further comprising: applying a DC deflection voltage between the blocker and a pair of deflection electrodes, while the ion beam traverses between the EDMA assembly and the energy spread reducer.

17. The method of claim 15, wherein the ion beam is provided to the EDMA assembly as a convergent ion beam.

18. The method of claim 15, wherein the energy spread reducer comprising:
  an upper ESR electrode, disposed above the beam axis; and
  a lower ESR electrode, disposed below the beam axis.

19. The method of claim 18, the energy spread reducer further comprising a middle ESR electrode, disposed between the upper ESR electrode and the lower ESR electrode.

20. The method of claim 16, wherein the blocker is disposed at least partially downstream to the pair of deflection electrodes.

* * * * *